March 24, 1970 M. STOLL 3,502,786
FLAT PACK SPACER OF LOW THERMAL DIFFUSIVITY
Filed June 14, 1967
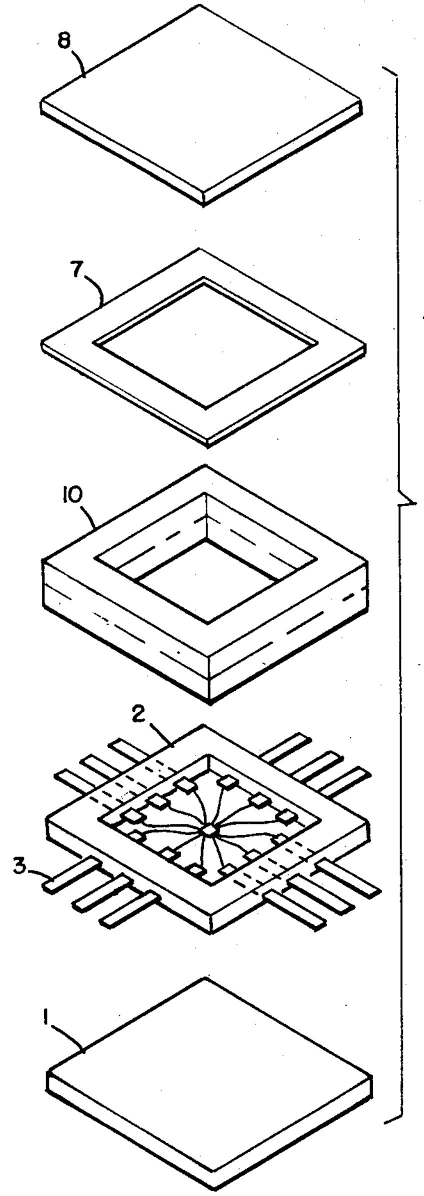
FIG 2
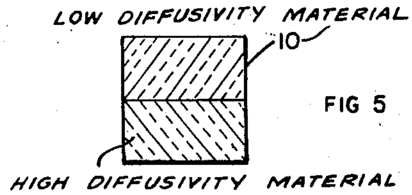
FIG 5
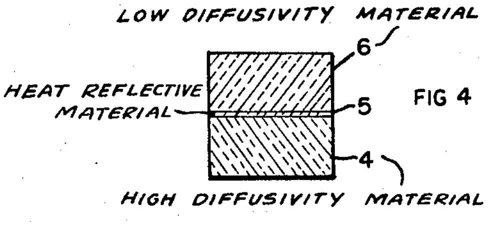
FIG 4
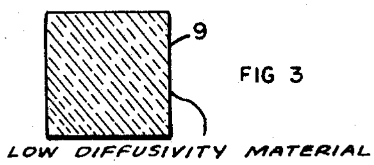
FIG 3
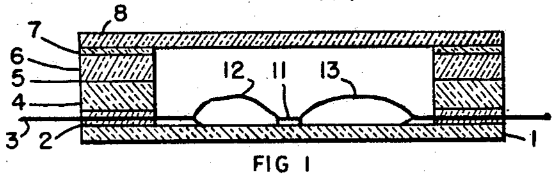
FIG 1
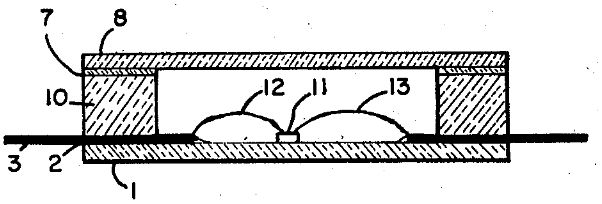
FIG b
INVENTOR.
MILTON STOLL
BY
Alfred W. Barber
ATTORNEY United States Patent Office 3,502,786

Patented Mar. 24, 1970

3,502,786

FLAT PACK SPACER OF LOW THERMAL DIFFUSIVITY

Milton Stoll, 14–19 212th St., Bayside, N.Y. 11360

Filed June 14, 1967, Ser. No. 654,024
Int. Cl. H05k 5/06
U.S. Cl. 174—52 4 Claims

ABSTRACT OF THE DISCLOSURE

The present invention relates to new and novel methods of and means for sealing flat-packs and the like. The term "flat-pack" is applied to heat sealed packages of tiny electronic integrated circuits or the like. These integrated circuits, for example, comprise transistors, diodes and resistors etched or otherwise formed on a chip of silicon and hermetically heat sealed in a sandwich of ceramic and glass or metal. This sandwich is built up starting with a bottom plate on which are plated leads or are mounted an annulus carrying wire leads to connect the internally mounted integrated circuit to the outside of the package. The term "annulus" is used here since, although it suggests a round package and most of the packages are rectangular, it is descriptive of the part. On top of the plated lead base or lead carrying annulus is mounted and sealed thereto a spacer annulus, and on top of this spacer annulus a layer of solder or glass seals the top cover. In assembling this device the lead carrying bottom plate or lead seal annulus and spacer annulus are first prepared as by a heat bonding process. The integrated circuit is mounted inside the initial assembly, usually in contact with the bottom plate, for heat transfer purposes and the leads are attached. The final step is to apply and seal the cover. This is a heat sealing process and a number of problems arise. It is the usual practice to use high thermal conductivity material for the spacer as well as other parts. This high thermal conductivity material is also chosen to have high thermal diffusivity such as beryllia. This carries too much heat away from the cover and often causes damage to the circuit. It also prolongs the time required to seal the cover, requires a large amount of applied heat and an excessively high temperature.

In accordance with the present invention a new and novel form of spacer annulus is used which greatly reduces the temperature required and the amount of heat required to seal the cover. It also reduces significantly the heating of the integrated circuit during the heat bonding of the cover to the package. This improvement is accomplished by using a spacer composed of low thermal diffusivity material such as thorium oxide, hafnium oxide, zirconium oxide or the like or compounded ceramics embodying such materials or resulting in material having similar thermal characteristics and insensitive to high thermal gradients. Diffusivity is defined as thermal conductivity divided by specific heat times density of the material. It is a characteristic which determines the rate at which heat flows from the cover being sealed away from such cover and to the sensitive integrated circuit.

BACKGROUND OF THE INVENTION

Field of the invention

The present invention relates to hermetic sealing as "Glass Uniting Processes" or "Glass to Metal Joints."

Description of the prior art

Prior art ceramic flat-packs employed spacer means which were of relatively high heat conductivity and high diffusivity resulting in rapid conduction of heat during sealing from the cover being sealed to the integrated circuit in such a manner as to require an excessive amount of heat application to the cover and also causing heat damage to the sensitive circuit. Shortening the time during which the heat was applied results in an imperfect seal.

SUMMARY

It has been found that a great improvement in the quality of the seal and greatly reduced chances of damage to the integrated circuit during the sealing operation result from using a spacer of low thermal conductivity, high specific heat and high density material such as thorium oxide or zirconium oxide. For a given amount of heat and temperature applied to the cover for sealing, the low diffusion of heat through the spacer results in significantly less heat reaching the integrated circuit, and also results in a higher temperature on the face of the spacer where the seal is being made with a lower applied temperature. These results are due to the steeper thermal gradient made possible by the precepts of the present invention.

Accordingly, one object of the present invention is to provide significantly reduced heat transfer from the cover of a flat-pack during the heat sealing operation.

Another object is to improve the cover seal of a heat sealed flat-pack.

A further object is to use a low heat diffusivity material as the spacer in a flat-pack.

Still another object is to protect the integrated circuit in a flat-pack during heat sealing of the cover.

A further object is to permit the use of higher temperature and shortened time in the heat sealing of a flat-pack without damaging the internal parts being sealed in.

These and other objects of the present invention will be apparent from the detailed description of the invention given in connection with the various figures of the drawing.

BRIEF DESCRIPTION OF THE DRAWINGS

FIGURE 1 is a cross-sectional view of one form of the present invention.

FIGURE 2 is an exploded view of the form of the invention shown in FIGURE 1.

FIGURES 3, 4 and 5 are cross-sectional views of forms of the spacer which may be used in accordance with the present invention.

FIGURE 6 is an alternate form of the present invention.

FIGURE 1 shows a cross-section of a flat-pack assembly comprising a bottom plate 1 on which is sealed a ring 2 carrying embedded leads 3, surmounted by spacer ring 4–5–6, in turn surmounted by sealing layer 7 and finally topped off by sealed cover 8. The integrated circuit sealed inside the package is shown at 11 with wires 12 and 13 connecting to leads 3. The spacer as shown may be fabricated of a glass or ceramic lower portion 4 and sealed to a low diffusivity portion 6 by a bond along line 5.

FIGURE 2 is an exploded view of the same form of the invention as that shown in FIGURE 1 wherein corresponding parts are designated by the same numerals except for the spacer 10 which is represented as a single piece device of low diffusivity material in place of the two part spacer 4–5–6 of FIGURE 1.

The steps in making the flat-pack generally include the preparation of an initial device including the bottom plate 1 to which is hermetically sealed the lead ring 2 surmounted by the spacer 10 (or 4–5–6 of FIG. 1) in turn hermetically sealed to the lead ring 2. Next the integrated circuit or other device to be enclosed is mounted generally in thermal contact with the base plate 1. This device 11 is then connected with the outer leads 3 by means of fine wires 12 and 13. At this point the package is complete except for the final sealing by means of the top plate 8. A glass or solder preform seal 7 is placed on top of the spacer 10 and finally the cover is placed on top of the preform. The upper surface of spacer 10 may be metalized or may carry a metal surface for better bonding to the cover. The final step is to heat seal the cover by melting the preform to the spacer. This heat sealing is necessary to complete the hermetic seal but during this heat sealing it is important that a minimum amount of heat shall reach the integrated circuit or other device contained in the package. It has been found in accordance with the present invention that making the spacer of a low diffusivity material such as thorium oxide, hafnium oxide or zirconium oxide or compounds such as stabilized zirconium oxide having similar diffusivity characteristics greatly reduces the heat transfer from the cover to the integrated circuit during the final heat sealing operation. The heat sealing should be completed as quickly as possible. The low diffusivity spacer prevents rapid dissipation of heat from the cover and hence permits the seal 7 to rise to sealing temperature quickly and hence promotes rapid sealing of the cover and sealing with substantially less applied heating power.

FIGURE 3 is a cross-section of a spacer which is composed of a single piece of the low diffusivity material as set forth above.

FIGURE 4 shows how the spacer may be fabricated of three different materials, the lower part 4, for example, being of a material having high diffusivity such as aluminum oxide and the upper part 6 being of the low diffusivity material with a heat reflecting layer of aluminum or the like 5 therebetween.

FIGURE 5 illustrates how spacer 10 can be composed of a high specific heat and density material lower portion and a low diffusivity upper portion bonded together along the dotted line.

FIGURE 6 shows an alternate form of the present invention in which the leads 3 are plated or etched directly on base 1 and the low diffusivity spacer 10 is sealed directly to base 1. Cover 8 is sealed to spacer 10 by means of a heat sealable preform 7. The integrated circuit or other device 11 to be sealed inside the package is connected to the through leads 3 by means of the usual interconnecting leads 12 and 13 or the circuitry may be deposited or etched directly on the bottom cover 1.

What I claim is:

1. A flat-pack device adapted to gradient heat sealing thereof, comprising;

a base carrying a plurality of bonded leads, and means hermetically bonded to said base for maximizing the thermal gradient by reducing heat transfer towards said base and for enabling a maximum thermal gradient during sealing and a maximum temperature at the sealing region from a minimum quantity of applied heat for faster and more efficient sealing and minimum heat transfer to said base and any contents of said flat pack in contact therewith, said means comprising, in turn, an annular spacer comprising thorium oxide hermetically bonded between said base and the sealing region.

2. A flat-pack device adapted to gradient heat sealing thereof, comprising;

a base carrying a plurality of bonded leads, and means hermetically bonded to said base for maximizing the thermal gradient by reducing heat transfer toward said base and for enabling a maximum thermal gradient during sealing and a maximum temperature at the sealing region from a minimum quantity of applied heat for faster and more efficient sealing and minimum heat transfer to said base and any contents of said flat pack in contact therewith, said means comprising, in turn, an annular spacer comprising stabilized zirconium oxide.

3. A flat-pack device adapted to gradient heat sealing thereof, comprising;

a base carrying a plurality of bonded leads, and means hermetically bonded to said base for maximizing the thermal gradient by reducing heat transfer toward said base and for enabling a maximum thermal gradient during sealing and a maximum temperature at the sealing region from a minimum quantity of applied heat for faster and more efficient sealing and minimum heat transfer to said base and any contents of said flat pack in contact therewith, said means comprising, in turn, an annular spacer comprising hafnium oxide.

4. A flat-pack device adapted to gradient heat sealing thereof, comprising;

a base carrying a plurality of bonded leads, and means hermetically bonded to said base for maximizing the thermal gradient by reducing heat transfer toward said base and for enabling a maximum thermal gradient during sealing and a maximum temperature at the sealing region from a minimum quantity of applied heat for faster and more efficient sealing and minimum heat transfer to said base and any contents of said flat pack in contact therewith, said means comprising, in turn, an annular spacer comprising a material selected from the group consisting of thorium oxide, stabilized zirconium oxide and hafnium oxide.

References Cited

UNITED STATES PATENTS

| | | | |
|---|---|---|---|
| 3,381,080 | 4/1968 | Stelmak ----------- | 174—52.5 |
| 3,404,213 | 10/1968 | Brookover et al. | |
| 2,999,964 | 9/1961 | Glickman. | |
| 3,072,832 | 1/1963 | Kilby. | |
| 3,213,337 | 10/1965 | Long. | |
| 3,340,602 | 9/1967 | Hontz. | |

OTHER REFERENCES

Brady, Materials Handbook, 9th ed., McGraw-Hill, New York, 1963, pp. 367, 767, 842 and 843.

DARRELL L. CLAY, Primary Examiner

U.S. Cl. X.R.

29—627, 588; 65—59; 287—189, 365